United States Patent [19]

Karpodines

[11] 4,349,084

[45] Sep. 14, 1982

[54] CONTROLLED AMBIENCE SPEAKER SYSTEM

[76] Inventor: Marco Karpodines, 9826 Pico Blvd., Los Angeles, Calif. 90035

[21] Appl. No.: 220,222

[22] Filed: Dec. 24, 1980

[51] Int. Cl.[3] .......................... H04R 1/28; H05K 5/00

[52] U.S. Cl. .................................... 181/146; 181/147; 181/156

[58] Field of Search ................................ 181/144–147, 181/151, 156, 148, 163, 199; 179/1 E

[56] References Cited

U.S. PATENT DOCUMENTS 3,729,061 4/1973 Tamura .............................. 181/146

4,128,738 12/1978 Gallery .......................... 181/146 X

FOREIGN PATENT DOCUMENTS 696671 9/1953 United Kingdom ................ 181/156

OTHER PUBLICATIONS

Cohen, "The Diffusion-8 Enclosure", *Radio and Television News,* Mar. 1954, pp. 55, 150.

*Primary Examiner*—L. T. Hix

*Assistant Examiner*—Thomas H. Tarcza

*Attorney, Agent, or Firm*—Nilsson, Robbins, Dalgarn, Berliner, Carson & Wurst

[57] ABSTRACT

A speaker system includes a housing with four side panels and a back panel. A speaker mounting panel with a plurality of openings therethrough is positioned opposite the back panel to enclose the housing and define an acoustic chamber therein. A packed fibrous sheet material is attached to cover the interior surfaces of the side and back panels. A pair of unmatched drivers and a tweeter are mounted to the mounting panel so that each projects frontwave sound through one of the panel openings and backwave sound into the acoustic chamber. An open-ended cylindrical member defining an acoustic passageway is attached about the periphery of another mounting panel opening and extends part way into the acoustic chamber. An acoustic curtain extends between opposite side panels in a serpentine configuration about a portion of the periphery of the two drivers on one side of the curtain and the periphery of the cylindrical member on the other side of the curtain. The curtain extends from the mounting panel and terminates a spaced distance from the acoustic cover on the back panel for enabling backwave sound to travel around the acoustic curtain and out through the acoustic passageway. The region behind the drivers and tweeter is filled with a loose fibrous dacron and a dacron curtain whose thickness can be adjusted.

21 Claims, 4 Drawing Figures

CONTROLLED AMBIENCE SPEAKER SYSTEM

BACKGROUND OF THE INVENTION

The present invention relates to sound generating systems and in particular to speaker system for transforming electrical signals into audio sound over substantially the entire audio frequency spectrum.

Typically, speakers utilized in home stereo systems or as monitors in recording studios include several individual speakers extending into a housing and arranged on a speaker mounting panel for projecting audio through openings in the mounting panel. Such speaker systems generally operate by dividing the audio frequency spectrum into several segments and then providing a different speaker to transform the electrical signal components in each spectrum segment into an audio sound. Such systems require that a cross-over network be used to interconnect the speakers so that the spectrum of frequencies actuating one of the speakers is isolated from the spectrum of frequencies actuating each of the other speakers.

More specifically, most present speaker systems include a woofer which is actuated in response to the low frequency segment of the audio frequency spectrum; a midrange speaker which is actuated in response to the midrange frequency segment of the audio frequency spectrum; and a tweeter which is actuated in response to the high frequency segment of the audio frequency spectrum. As previously indicated, complex cross-over networks to separate the portions of the frequency spectrum which will actuate each speaker are then incorporated.

In the past, considerable effort has gone into perfecting the cross-over networks. However, such networks inevitably have limitations which significantly effect the quality of audio sound generated by the speakers both separately and collectively. For example, the speakers utilized may be so susceptible to interaction between each other that the cross-over network must be designed to have steep cross-over slopes. Such a requirement frequently results in severe spikes, peaks, ringing and phase shifts in the response of the speaker which would be considered unacceptable if observed even in the most rudimentary audio receiver or amplifier.

Cross-over networks also have the effect of causing a loss of efficiency which results in additional amplifier distortions or higher amplifier power requirements. They also have the effect of reducing the dampening factor that most amplifier designers design into their amplifiers to help reduce excessive cone motion of the woofer. This dampening factor also improves transient response of the woofer. However, this dampening factor tends to be reduced, and its attendant advantages eliminated, by the fact that the cross-over network in most speaker systems becomes the "window" that the amplifier is looking at rather than the speaker which the dampening factor can control. Indeed, many amplifiers exhibit severe cross-over notch distortion and instability as the result of having to "look into" a cross-over network with a combined inductive and resistive load. The result is a serious degradation in the clarity of the audio sound produced by the speaker system in response to electrical signals from the receiver or amplifier.

The utilization of a woofer and midrange speaker, which is the reason the above-described cross-over network is required, produces other inherent distortions in the audio sound generated. Specifically, a woofer, which may typically be in the range of about 12 to 15 inches in diameter, generally has a high mass and extreme cone excursion to enable it to move large quantities of air at the low frequency levels. However, that high mass and extreme cone excursion makes the typical woofer incapable of reproducing upper bass frequencies which occur simultaneously with sounds in the lower bass register. In addition to this dynamic response degradation and inefficiency, transient response in such woofers also suffers, particularly in acoustic suspension designs where movement of the speaker cone is impeded by the compressed volume of air within a tightly enclosed housing. The result is a severe loss of definition and dynamics at the high volume levels and a considerable change in apparent listening characteristics coupled with the loss of bass at the low listening levels.

In addition to the woofer, most speaker systems incorporate a midrange speaker, typically having a three to five inch diameter, to project the midrange band of frequencies in the audio frequency spectrum. However, the relatively small size of the typical midrange speaker is a paradox since it cannot move enough air in the vital midrange in which it is supposed to operate. Consequently, loud orchestral passages with full bass of rock music with hard driving guitar sounds are often reproduced with a severely limited midrange air motion totally out of proportion to either the bass or treble frequencies, thereby limiting reproduction of the original dynamics of the sound source. Furthermore, the inability of the midrange speaker to move the amount of air required at high audio volumes results in a quite strident and fatiguing sound to the listener's ear. In an effort to alleviate these problems, some systems utilize a midrange horn which increases efficiency and air loading. However, the midrange horn produces a very hollow middle register sound with increased stridency and harshness. It will also be appreciated that full control of the cone motion is desired to improve the midrange speaker's transient response. Such control would be provided utilizing the amplifier's signal dampening (dampening factor) and the back EMF forces produced by the motion of the components in the speaker system. However, in a typical speaker system the cross-over network in effect "absorbs" the speaker back EMF effects and the dampening effects from the amplifier. Such cross-over network "absorption" requires compensation to restore some measure of control over cone motion. Typically, this compensation is provided by designing the spider or suspension since experience has shown that excessive cone motion must be controlled at the suspension points of the speakers. However, such an approach to controlling cone motion also reduces transient response of the woofer and midrange speakers. Thus, the ideal speaker should not only have the necessary frequency response characteristics, but also excellent transient response and excellent dymanic response characteristics. However, in the typical speaker system with a cross-over network and a typically sized midrange speaker, the cross-over network automatically prevents modification of the speaker suspension to maximize transient response and dynamic response characteristics.

In addition to electrical signal separation between speakers in a speaker system, speaker system designers have also sought acoustic separation, particularly between the midrange speaker and the woofer. Such acoustic separation and isolation is desired to minimize distortion caused by the imposition of, e.g., the bass sound waves against the back of the midrange speaker cone which prevent the midrange speaker from moving as freely as it would otherwise move.

In some prior art systems, the desired acoustic separation and isolation has, to a degree, been achieved by physically isolating the midrange speaker in a box within the speaker system housing. The backwave, i.e., the sound projected from the back of the woofer into the housing around the woofer, may then be channeled through a ducted portion which may either be a hollow cylinder or may be a cylinder filled with an acoustic material, to provide a passageway for directing the backwave from the woofer out through the front of the speaker. In this manner, the backwave of the bass can be separated from the backwave of the midrange. However, even in systems where the backwave of the woofer is projected through a ducted port, the backwaves of the midrange speaker are characteristically suppressed. This backwave suppression is a consequence of the enclosure incorporated to obtain acoustic isolation and separation in the speaker system. It also automatically takes place since the cabinet is regarded almost entirely as a means of containing or at most augmenting the backwave response of the woofer in the bass frequency range. The present invention does not utilize the speaker enclosure as a bass frequency control mechanism. Rather the enclosure provides maximum utilization of the backwaves over a wide band of frequencies, specifically including the middle and upper middle frequencies. However, this usage, to be most effective, must make use of a relatively large total sound radiating surface. The typically sized midrange speaker, even if its backwave were to be utilized, cannot move enough air for its backwave motion to be of any significance. Thus, most speaker systems, at least in the middle and upper middle frequencies, as a result of not utilizing this backwave response over a wide band of frequencies, specifically including middle and upper middle frequencies, act to "rectify" the final audio sound characteristic. This suppression of the backwave audio response over these vital middle and upper middle frequencies results in a significant decrease in dynamic response and ambient characteristics because this backwave is not simply a phase shifted reproduction of the frontwave but is a complex wave motion which can contribute significantly to dynamic response and the naturally occurring ambient characteristics of the original sound source.

SUMMARY OF THE INVENTION

The present invention addresses the above-described problems by providing a speaker system with two broadband drivers instead of the conventional woofer and the midrange speakers. The two drivers are sufficiently large to generate the necessary amount of air movement and yet are not limited in their frequency response over a broad range of frequencies. One of the drivers preferably has a frequency range extending from about 20 Hertz up to about 5000 Hertz while the other driver, which is preferably placed vertically below the first driver, has a frequency response in the range of about 20 Hertz up to about 10,000 to 12,000 Hertz with each of the speakers capable of producing overtones in the higher frequency ranges. A tweeter is also provided to generate high frequency audio.

Because both of the drivers generate sound over similar portions of the audio frequency spectrum, the need for a conventional cross-over network is eliminated although a high pass capacitor is inserted in series with the tweeter to prevent physical damage to the tweeter from high amplitude, low frequency electrical signals. The tweeter with its high pass filter and the two drivers are connected in a parallel arrangement and are connected directly to the output terminals of the speaker system. The elimination of the cross-over network also results in significant sound reproduction improvements which have been heretofore impossible. By way of explanation, it will be appreciated that the ideal speaker would generate air motion over a wide band of frequencies which would essentially duplicate the air motion of the original sound source. For example, a small number of musicians, even several trumpets playing together, cannot sound like a full 14-piece brass and rhythm section because the sounds are being produced by a larger overall apparent sound source over a wide band of audio frequencies. But the loudspeaker as a typical multispeaker system does not function as a large wide frequency band sound source. However, the present invention utilizes two or more drivers (8–10 inches) to produce sound over a wide band of frequencies which has been found to duplicate the air motion characteristics of the original sound source much more clearly than in prior systems. The mid frequencies are in a sense being produced as big as the bass frequencies, as in live sound. Further, the present invention has a large sound radiating surface moving middle frequencies and beyond, which enables use of the backwave radiation of the large sound radiating source at midrange frequencies.

Also, the invention has a potential for providing maximum dampening of undesirable cone motion in a midrange transducer, specifically, a typical multi-transducer speaker system with a typically small midrange speaker and a crossover network, uses the suspension components of the transducer to provide the necessary dampening. However, the elimination of the cross-over network in the present invention enables the back EMF of the 8-inch transducers to be effectively used to provide this dampening over a wide range of frequencies and particularly over the midrange frequencies. Additionally, previously insignificant sources of transient response degradation in the midrange band of frequencies become important with the demise of the cross-over network. For example, it has been found that the resistance between the drivers interconnected within the enclosure has an adverse effect on transient response characteristics. Specifically, with a cross-over network the resistance factor is not an important factor because of the highly resistive and inductive load of the cross-over network. Upon removing the cross-over network, the previously minor factor of inter-transducer resistance now becomes a limiting and important factor even beyond mere current carrying capacity of the interconnecting wire. Indeed, this is particularly true since the present invention makes use of the backwave response of the drivers at middle and upper frequencies where transient response characteristics are important. Thus, the usage of extremely low resistance wire for interconnection now can be heard due to full utilization of the backwave over a wide band of frequencies.

In addition to the use of low resistance wire, the two drivers are selected to have a minimum cone body mass; only two windings (the minimum number possible) in the voice coil to decrease the weight of the coil and allow greater responsiveness; and compliances in the speaker which are as free as possible to move in response to actuating forces to thereby minimize the frequency of the cone resonance. (It will be appreciated that in most speakers, a low frequency cone resonance is achieved by weighting the cone which results in decreased dynamic response.)

In addition to the above-described novel feature, the present speaker system does not suppress the backwave from the two drivers in the middle or upper middle frequencies but rather combines the backwaves from the two drivers and channels the combined backwaves through a ducted port. The result is that the sound generated by the speaker in accordance with the invention is not a rectified sound wave comprised merely of the frontwave, but rather is a combination of the front and backwaves of the speaker over a wide band of frequencies which enables a speaker system in accordance with the invention to produce a clearer sound with much greater dynamic response and without the loss of a substantial portion of the ambient natural sound characteristics.

By way of explanation, when sound is generated by an orchestra in a live performance, the hearer not only hears sound directly from the orchestra but also hears indirect sound from the walls, ceiling and other surfaces of the concert hall itself. This indirect sound is generally known as the ambient sound and is the direct sound modified by the surfaces from which it bounces and delayed ever so slightly because of the longer distances it must travel to reach the hearer's ears. When the sound of a concert is recorded, both the direct and ambient sound is recorded and preserved on tape or other suitable medium. However, when the sound waves are reproduced, by a tape recorder or record player, the limitations of prior speaker systems have in essence caused the loss of a significant portion of the sound wave which has resulted in the loss of a significant portion of the ambience in the original sound. This loss of ambience in the reproduced sound results in a discernable decrease in the dynamics and an increase in distortion of the reproduced sound when compared with the dynamics of the live sound.

This deficiency in the ability of speaker systems to recreate the ambient sound of speaker systems was recognized by Bose and resulted in the creation of the Bose speaker system. However, unlike applicant's invention, the Bose system incorporated backfacing speakers to assure that the forward wave from the backfacing speakers would be reflected from the walls before reaching the ears of the hearer. The reflected sound from the rear speakers then combined with the nonreflected forward sound from one front-facing speaker to produce an artificial or simulated ambience. However, the Bose speaker still in effect suppressed the backwave from the various speakers in the speaker housing thereby effectively rectifying the sound generated by the speakers.

By contrast, applicant's speaker system recreates the true ambience of the original sound by redirecting the sound projected into the speaker system cabinet by the back of the speaker over a wide range of frequencies around and through the ducted port. The sound produced by the back of the speaker inside the speaker cabinet is therefore not suppressed in applicant's invention.

To accomplish this result, a controlled ambient speaker system in accordance with the invention includes a housing having a back panel, side panels and a speaker mounting panel, which are combined to define an acoustic chamber inside the housing. The speaker mounting panel has a first and second driver opening, a tweeter opening and a ducted port opening. A first driver speaker is mounted to the mounting panel in such a way that the frontwave of the first driver is projected through the first driver opening. Similarly, a second driver is mounted to the mounting panel for projecting the frontwave of the sound through the second driver opening and a tweeter is mounted to the mounting panel for projecting the tweeter's frontwave sound through the tweeter opening. As previously indicated, the first and second drivers and the tweeter are connected in parallel with a high pass filter capacitor connected in series with the tweeter to protect the tweeter from damage due to high amplitude, low frequency signals. An open-ended cylindrical member is attached to the ducted port opening and extends into the acoustic chamber of the housing.

An acoustic covering comprising a layer of packed fibrous material such as cotton or the like is disposed to cover the back and side panels of the speaker chamber. A sound-absorbing acoustic curtain is also attached in the interior of the acoustic chamber for bifurcating the acoustic chamber into a speaker portion and a ducted port portion. The curtain has a serpentine configuration extending generally perpendicularly from the inside surface of the mounting panel so that the acoustic curtain follows a portion of the periphery of the first and second drivers with the first and second drivers being positioned on one side of the curtain and also follows a portion of the periphery of the cylindrical member extending into the acoustic chamber so that the ducted port is on the other side of the acoustic chamber.

The acoustic curtain extends from the back of the mounting panel toward the back panel of the housing and terminates a spaced distance from the acoustic covering over the back panel. The acoustic curtain is preferably made from a packed fibrous material and is loosely mounted between two opposing side panels to allow movement of the curtain in response to sound generated by the first and second drivers and the tweeter. The space between the end of the acoustic curtain and the acoustic covering over the back panel provides a passageway between the speaker portion of the acoustic chamber and the ducted port portion of the acoustic chamber to allow passage of the backwave from the speaker portion to the ducted port portion and out through the ducted port.

Finally, a quantity of chamber filler comprising loose, unlayered, unpacked, unwoven fibrous material is provided to substantially fill the speaker portion of the speaker chamber. At least one second layer of similarly unpacked, unwoven fibrous material but in layered configuration may be provided in the speaker portion of the acoustic chamber next to the acoustic curtain and extending from the back of the speaker mounting panel to the acoustic covering on the inside surface of the back panel.

The adjustment and control of the backwave midrange response of the system may be exercised by varying the density and positioning of the continuous layer of fibrous material next to the acoustic curtain and extending from the back of the speaker mounting panel to the acoustic covering on the inside of the back panel and in the nature and density of the loose fill packing material.

BRIEF DESCRIPTION OF THE DRAWINGS

A complete understanding of the present invention and of the above and other advantages thereof may be gained from a consideration of the following description of the preferred embodiment and in conjunction with the accompanying drawings in which.

DETAILED DESCRIPTION

Figure 1:
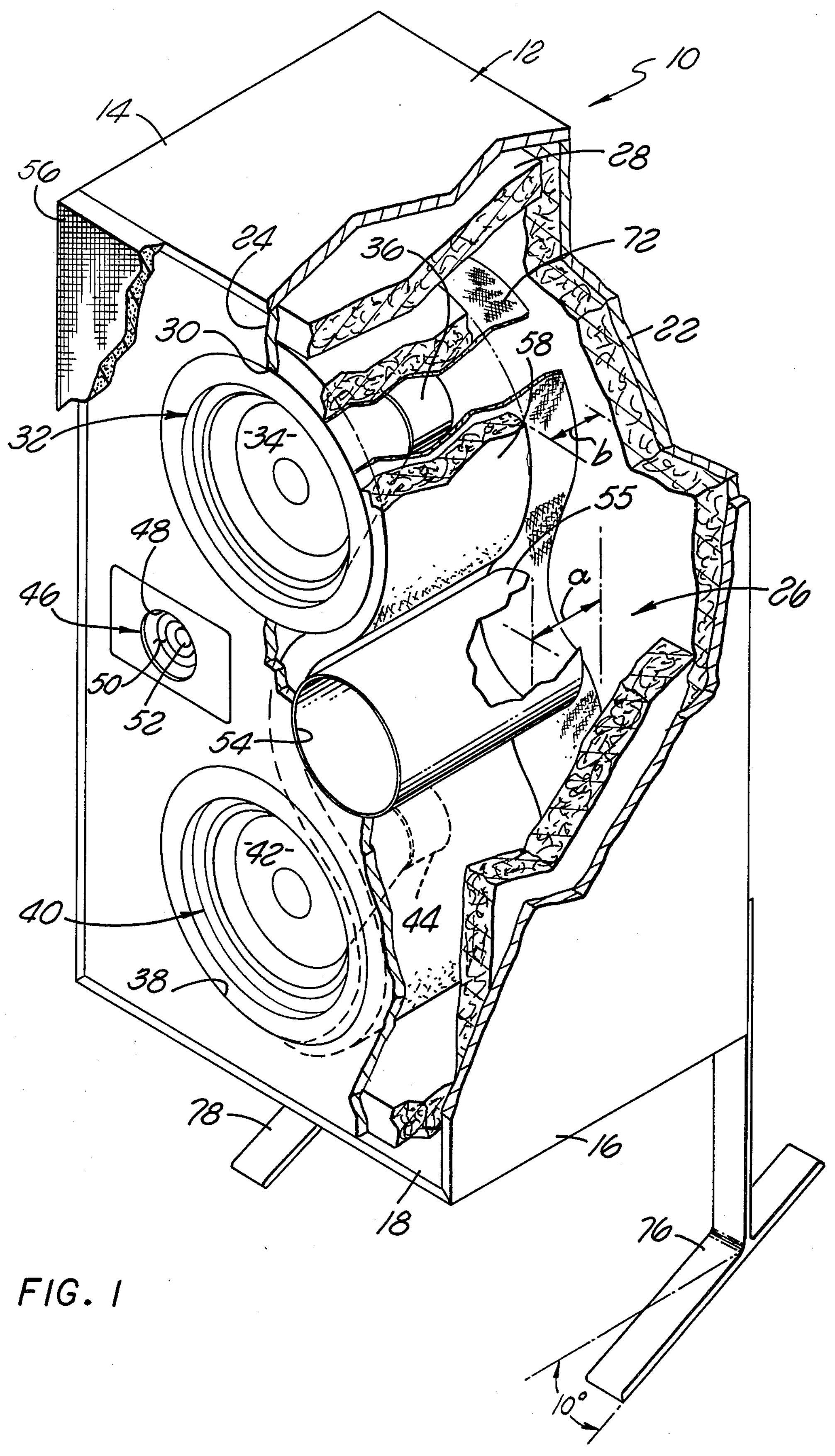
FIG. 1 is a perspective cut-away view of a speaker system in accordance with the invention showing the various internal components and arrangement of the speaker system.
Figure 2:
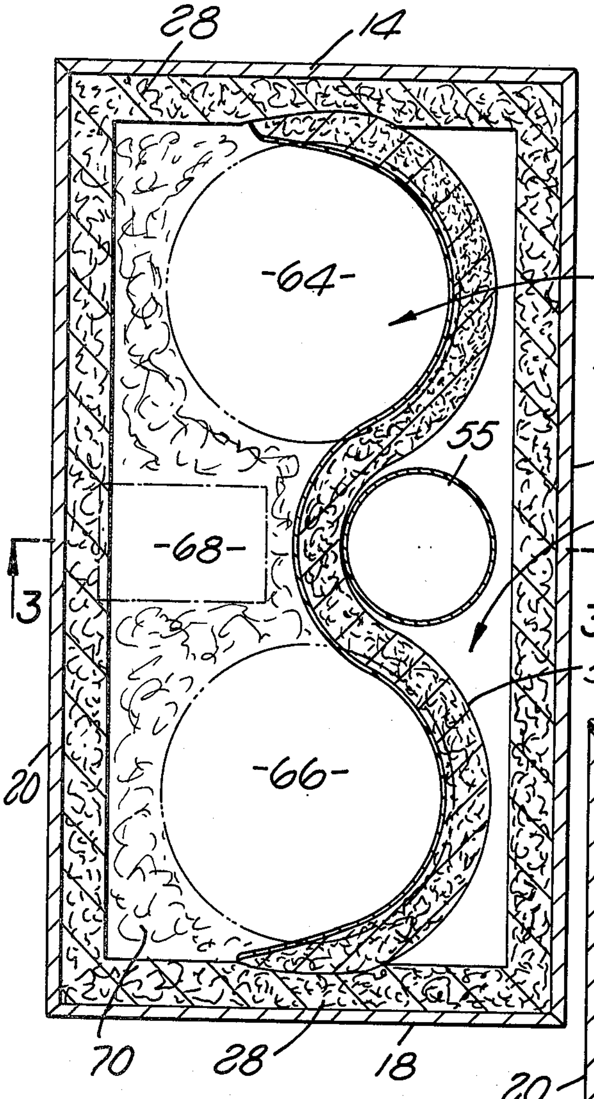
FIG. 2 is a front plan view of the speaker system in accordance with the invention as viewed with the front speaker mounting panel removed.
Figure 3:
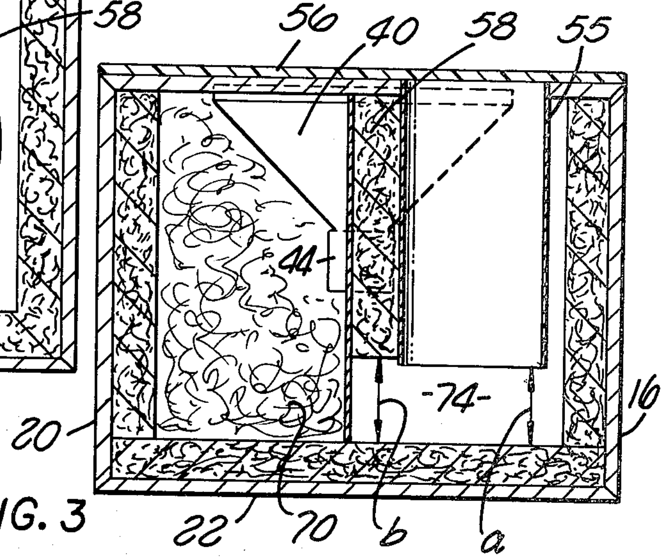
FIG. 3 is a top crosssectional plan view of the speaker system in accordance with FIGS. 1 and 2 through section 3—3.

Referring first to FIGS. 1, 2 and 3, a speaker system 10 in accordance with the invention comprises a cabinet housing 12 made from wood or any other suitable material defining a box-like structure having side panels 14, 16, 18 and 20 and a back panel 22. A speaker mounting panel 24 is attached about the peripheral edges of the side panels 14, 16, 18 and 20 to cover the opening of the speaker housing 12 opposite the back panel 22. The interior of the cabinet housing 12 defined by the side panels 14, 16, 18 and 20, the back panel 22, and the speaker mounting panel 24 define an interior acoustic chamber 26 for the speaker system 10.

An acoustic covering 28 is attached to the interior surfaces of the side panels 14, 16, 18 and 20 and the back panel 22 of the cabinet housing 12. In the preferred embodiment, the acoustic covering 28 comprises a layer of packed fibrous material which may, for example, be unwoven fibrous cotton or any other suitable sound-absorbing material. The acoustic covering may be of any suitable thickness but in the preferred embodiment is a thickness of about $\frac{3}{4}$ of an inch to one inch.

The speaker mounting panel 24 covering the front opening of the cabinet housing 12, has a first driver mounting opening 30 which has a suitably configured circumferential edge for mounting a first driver 32 with its cone 34 and magnetic actuating coils 36 extending into the acoustic chamber 26. Similarly, a second driver mounting opening 38 is provided with a suitably configured circumferential edge for mounting a second driver 40 thereto with the cone 42 and magnetic actuating coils 44 extending into the acoustic chamber 26. Finally, a suitable tweeter 46 is mounted to the circumferential edge of a tweeter mounting opening 48 in the speaker mounting panel 24 with its cone 50 and magnetic actuating coil 52 extending into the acoustic chamber 26.

In the preferred embodiment, the first speaker mounting opening 30 is positioned vertically above the second speaker mounting opening in the speaker mounting panel 24 with the tweeter mounting opening 48 positioned between the first and second speaker openings 30 and 38 and displaced slightly to one side thereof.

A fourth opening 54, known as the ducted port opening, is also provided through the speaker mounting panel 24 laterally adjacent the tweeter speaker opening 48, also between the first and second speaker openings 30 and 38. Like the tweeter speaker opening 48, the ducted port opening 54 is displaced to one side of the axis of alignment between the first and second driver openings 30 and 38. An open-ended cylindrical tube 55 is attached to the speaker mounting panel about the periphery of the ducted port opening 54 and extends from the ducted port opening 54 into the acoustic chamber 26 terminating a first distance "a" from the surface of the acoustic cover 28 on the back panel 22.

A suitable front panel 56 comprised of cloth or other suitable sound-permeable material may be positioned to hide the face of the speaker mounting panel 24.

In accordance with the invention, an acoustic curtain 58 is positioned to bifurcate the acoustic chamber 26 into a speaker portion 60 and a ducted port portion 62. The acoustic curtain 58 may be made of any suitable sound-absorbing material and may, for example, be made of a layer of packed fibrous cotton material approximately one inch thick similar to that used for the acoustic cover 28. In one embodiment, both the acoustic cover 28 and the acoustic curtain 58 may be made of material sold under the brand name KIMSUL TM.

The acoustic curtain 58 has a first end which is attached by stapling or the like to the inside surface of the side panel 14 and follows a generally serpentine-shaped path extending around a portion of the periphery of the first driver 32 reversing its curvature to curve around a portion of the cylindrical tube 55 and again reversing the direction of its curvature to follow a curved peripheral portion of the second driver 40 and finally terminating at a point of attachment to the inside surface of the side panel 18.

The acoustic curtain 58 extends from the inside surface of the speaker mounting panel 24 downward toward the acoustic cover 28 on the back panel 22 and terminates a second distance "b" above the acoustic cover 28 on the back panel 22. In the preferred embodiment, distance "b" between the terminating edge of the acoustic curtain 58 and the acoustic cover 28 of the back panel 22 and the distance "a" between the terminating end of the ducted port cylinder 55 and the acoustic cover 28 of the back panel 22, is the same.

The acoustic curtain 58 so shaped defines a first acoustic tunnel portion 64 of the speaker portion 60 of the acoustic chamber 26 which extends rearwardly from the first driver 32; a second acoustic tunnel portion 66 of the speaker portion 60 of the acoustic tunnel 26 which extends rearwardly from the second driver 40; and a tunnel convergence region 68 between the first and second acoustic tunnel portions 64 and 68. The tweeter is mounted to project sound into the tunnel convergence region 68. The ducted port opening 54 is located laterally opposite the tweeter between but laterally displaced from the two drivers with the end of the cylindrical tube 55 opposite the acoustic cover 28 on the back panel 22 positioned with the ends of the first tunnel portion, tunnel convergence region and second tunnel portion terminating adjacent to and about the periphery of the interior end of the cylindrical tube 55.

In accordance with the invention, the regions of the acoustic chamber 26 directly behind the first and second drivers 32 and 40 and the tweeter 46 are filled with unwoven, loose fibrous material 70 which may, for example, be a loose dacron material. In addition, in the preferred embodiment, at least one layer 72 of sound-permeable material is provided adjacent the acoustic curtain 58 in the speaker portion 60 of the acoustic chamber 26 to extend lengthwise from the back surface of the speaker mounting panel 24 to the surface of the acoustic cover 28 covering the back panel 22. Thus, while the acoustic curtain 58 extends only partway between the back surface of the speaker mounting panel 24 and the acoustic cover 28 of the back panel 22, leaving a gap 74 therebetween, the thin, soundpermeable curtain 72 actually bifurcates the acoustic chamber 26. In the preferred embodiment, the sound-permeable curtain 72 is made of at least one thin layer of very loose synthetic polyester textile fiber material similar to the unlayered material 70 used to fill the space behind the two drivers 32 and 40 and the tweeter 46.

The sound projected from the speaker system can be varied by altering the type of material used for the acoustic curtain and acoustic cover, although the preferred material is sold under the brand name KIMSUL TM. The thickness of the curtain as well as its degree of compression can also be varied to the amount of ambient sound projected. Finally, the type and density of the unlayered sound-permeable material 70 and the type, density and number of layers of the layered sound-permeable curtain material 72 may be varied to achieve a desired degree of ambience. Of course, it will be appreciated that the degree and nature of such variations are subject to individual tastes and will therefore vary according to the subjective evaluation of the sound by the person constructing a speaker system in accordance with the invention.

In operation, the speaker system in accordance with the invention provides a means of redirecting the backwaves of the two drivers and the tweeter from inside the speaker housing 12, where it would normally be suppressed, and projecting those backwaves through the gap 74 and out through the ducted port cylinder 55. The resultant projected sound has been found to include ambient components of the sound which have heretofore been suppressed in prior art systems. Further, the present invention projects sound with a minimum of distortion over a very broad frequency spectrum.

In order to enhance the sound projected from the speaker system in accordance with the invention, it has been found preferable to mount the speaker a spaced distance above the floor as illustrated in FIG. 1 where a pair of T-shaped legs 76 and 78 which are attached to the outside surface of the back panel 22. In the preferred embodiment, the speaker is mounted approximately 8 inches above the floor to allow maximum airflow underneath and entirely around the speaker system. In addition, the legs 76 and 78 are configured so that the face of the speaker tilts by about 10 degrees from the vertical so that sound is projected slightly upwardly from the face of the speaker system.

As previously indicated, the first and second drivers 32 and 40 each have a broad frequency response spectrum to generate low, midrange and a degree of high frequencies. Although the first driver 32 and the second driver 40 have similar frequency response spectrums, in the preferred embodiment, the upper driver 32 has a somewhat lower-upper frequency response spectrum than the lower driver 40, extending from about 20 Hertz up to about 5000 Hertz. The second driver may then have a frequency response spectrum in the range of about 20 Hertz to about 12,000 Hertz. Of course, it will be appreciated that each of the drivers 32 and 40 has the capability of generating higher frequency overtones. However, the high frequencies are primarily generated by the tweeter.

Figure 4:
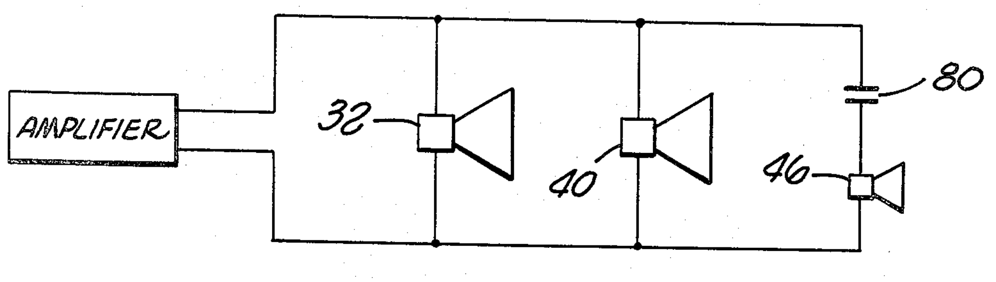
FIG. 4 is a schematic diagram showing the electrical interconnection of the speakers incorporated in the speaker system shown in FIGS. 1, 2 and 3.

Referring to FIG. 4, the two drivers 32 and 40 and the tweeter 46 are interconnected together in parallel. Because the two drivers have substantially the same frequency response spectrum and are intended to generate sound over the same or substantially the same frequency spectrum, it has been found that the crossover network required to prior art speaker systems can be eliminated with only a suitable high pass filter capacitor 80 interconnected in series with the tweeter 46 in the parallel branch of the circuitry which connects the tweeter 46 to the two drivers 32 and 40. Therefore, it can be seen that not only are the woofer and the midrange speaker of conventional speaker systems eliminated and replaced by two drivers 32 and 40 but the crossover network in accordance with prior art speaker systems is also eliminated.

While the drivers in accordance with the invention may be of any suitable type, in the preferred embodiment the drivers are selected so that the mass of the cone body is minimized, the mass of the voice coil is minimized and the compliance of the cone made with a minimum resistance to cone movement.

The present invention thus provides a speaker system capable of reproducing sound with substantially less distortion than prior art systems and which reproduces the ambient components of sound making the reproduced sound much more realistic and livelike.

While the above invention has been described utilizing two drivers, one tweeter and one ducted port, it will be appreciated that the present invention may be practiced utilizing four drivers, two tweeters and one, two ducted ports or any other suitable number of drivers, tweeters and ducted ports. Accordingly, all such multiple arrangements are also within the scope and teaching of the present invention.

What is claimed is:

1. A controlled ambience speaker system comprising:

a housing having a back panel, side panels and a speaker mounting panel for defining an acoustic chamber, the front speaker mounting panel having at least one ducted port opening, at least one first driver opening, at least one second driver opening and at least one tweeter opening;

a first driver mounted to the panel for projecting sound through the first driver opening;

a second driver mounted to the panel for projecting sound through the second driver opening;

a tweeter mounted to the panel for projecting sound through the tweeter opening, the first and second drivers and tweeter being interconnected in parallel;

an open-ended duct member mounted to the panel about the periphery of the ducted port opening and having a length extending into the ducted port portion of the speaker chamber and terminating a first distance from the back panel;

an acoustic covering comprising a layer of packed fibrous material disposed to cover the back and side panels in the speaker chamber;

a sound absorbing acoustic curtain positioned in the acoustic chamber to bifurcate the acoustic chamber into a speaker portion and a ducted port portion, the curtain comprising a first layer of packed fibrous material having a length extending from the front panel and terminating at a terminating edge a second distance from the back panel, and at least one second layer of loose fibrous material extending substantially between the front panel and back panel, the acoustic curtain being loosely mounted between two opposing side panels for moving in response to the sound generated by the first and second drivers and tweeters whereby the distance between the back of the first driver and the ducted port opening and the second driver and the ducted port opening around the terminating edge of the acoustic curtain is sufficiently short to enable the backwave sound in the midrange frequencies from the first and second drivers to be projected outwardly from the ducted port without being substantially absorbed in the speaker portion; and a quantity of chamber filler comprising loosely packed fibrous material substantially filling the speaker portion of the speaker chamber.

2. The controlled ambience speaker system of claim 1 wherein the second driver is selected to have a higher frequency response than the first driver.

3. The controlled ambience speaker system of claim 2 wherein the first and second drivers have a frequency response spectrum extending from about 20 Hertz to at least about 5000 Hertz.

4. The controlled ambience speaker system of claim 1 wherein the first driver has a frequency response spectrum extending from about 20 Hertz to a maximum frequency of at least about 5000 Hertz and the second driver has a frequency response spectrum extending from about 20 Hertz to a maximum frequency greater than the maximum frequency of the first driver.

5. The controlled ambience speaker system of claims 2, 3 or 4 wherein the first and second drivers are vertically aligned with the second driver positioned below the first driver.

6. The controlled ambience speaker system of claim 1 wherein the first and second drivers and the tweeter are electrically interconnected in parallel with No. 10 gauge wire.

7. The controlled ambience speaker system of claim 1 wherein the acoustic covering and the first layer of the acoustic curtain are made of packed, unwoven fibrous cotton.

8. The controlled ambience speaker system of claim 1 wherein the at least one second layer of the acoustic curtain is made of unwoven, synthetic polyester textile fiber.

9. The controlled ambience speaker system of claim 1 wherein the at least one second layer of the acoustic curtain is made of unwoven, fibrous lambs wool.

10. The controlled ambience speaker system of claims 1 or 7 wherein the chamber filler comprises synthetic polyester textile fiber.

11. The controlled ambience speaker system of claim 1 wherein the first and second distances are in the range of about one to three inches.

12. The controlled ambience speaker system of claim 1 wherein the first and second distances are in the range of about one-tenth to one-third the length of the acoustic curtain and length of the duct member along their respective dimensions extending from the speaker mounting panel into the acoustic chamber respectively.

13. The controlled ambience speaker system of claim 1 wherein the first and second distances are about equal.

14. A controlled ambience speaker system for attachment to an actuating signal source comprising:

a speaker housing;

a speaker mounting panel with at least first driver opening, at least one second driver opening, at least one tweeter opening, and at least one ducted port opening mounted to the speaker housing for defining an acoustic chamber therein;

at least one first driver each mounted to the panel and extending into the acoustic chamber for projecting frontwave sound forwardly through one of the first driver openings and backwave sound rearwardly into the acoustic chamber;

at least one second driver each mounted to the panel and extending into the acoustic chamber for projecting frontwave sound forwardly through one of the second driver openings and backwave sound rearwardly into the acoustic chamber;

at least one tweeter each mounted to the panel and extending into the acoustic chamber for projecting frontwave sound forwardly through one of the tweeter openings and rearwardly into the acoustic chamber, the first and second drivers and the tweeter being electrically interconnected in parallel for connection to the signal source;

an acoustic covering comprising a layer of packed fibrous material disposed in the acoustic chamber adjacent the interior surfaces of the speaker housing;

an acoustic curtain made from a sheet of packed, sound-absorbing fibrous material extending from the panel into the acoustic chamber and attached for dividing the acoustic chamber into a speaker portion and a ducted port portion, the acoustic curtain terminating at a terminating edge a first distance from the acoustic covering for defining a rear portion for communicating sound between the speaker portion and the ducted port portion, the acoustic curtain being curved about a portion of the periphery of each of the first and second drivers for defining a first acoustic tunnel portion extending rearward of the first driver in the speaker portion of the acoustic chamber and terminating in an end region of the acoustic chamber, a second acoustic tunnel portion extending rearward of the second driver in the speaker portion of the acoustic chamber, terminating in the end region of the acoustic chamber longitudinally meeting the first acoustic tunnel portion for defining a backwave combining region therebetween, the tweeter being mounted whereby backwave sound from the back of the tweeter projects backward into the sound combining region;

an open-ended cylindrical member mounted to the speaker mounting panel about the ducted port opening, extending from the panel into the ducted port portion of the acoustic chamber and terminating a second distance from the acoustic covering for communicating the backwave sound in the midrange frequencies from the first and second drivers through the ducted port opening, the cylindrical member being positioned laterally between the first and second acoustic tunnels and laterally adjacent the sound combining region whereby the distance between the back of the first driver and the ducted port opening and the second driver and the ducted port opening around the terminating edge of the acoustic curtain is sufficiently short to enable the backwave sound in the midrange freqiencies from the first and second drivers to be projected outwardly from the ducted port without being substantially absorbed in the speaker portion; and a quantity of unwoven, loose fibrous material positioned to substantially fill the region of the acoustic chamber behind the first and second drivers and the tweeter.

15. The controlled ambience speaker system of claim 14 further comprising a sound modifying curtain positioned adjacent the acoustic curtain in the speaker portion and extending substantially between the panel and the acoustic covering opposite the panel to thereby bifurcate the rear portion, the sound modifying curtain being made from a loosely packed fibrous material.

16. The controlled ambience speaker system of claim 15 wherein the sound modifying curtain is made from synthetic polyester textile fiber.

17. The controlled ambience speaker system of claim 14 wherein the driver is selected to have a higher frequency response than the first driver.

18. The controlled ambience speaker system of claim 14 wherein the first driver has a frequency response spectrum extending from about 20 Hertz to a maximum frequency of at least about 5000 Hertz and the second driver has a frequency response spectrum extending from about 20 Hertz to a maximum frequency greater than the maximum frequency of the first driver.

19. The controlled ambience speaker system of claim 14 wherein the first and second distances are in the range of about one to three inches.

20. The controlled ambience speaker system of claim 14 wherein the first and second distances are in the range of about one-tenth to one-third the length of the acoustic curtain and length of the duct member respectively.

21. A controlled ambience speaker system comprising:

a housing defining an acoustic chamber therein having sound-absorbing interior walls and having a central sound-absorbing curtain for bifurcating the acoustic chamber into a speaker portion and a ducted port portion, the curtain terminating at a terminating edge a spaced distance from sound-absorbing interior walls for defining a sound passageway between the speaker portion and the ducted port portion;

at least one pair of driver speakers mounted to the housing facing outwardly from the housing and having a back portion extending into the speaker portion of the acoustic chamber;

at least one tweeter mounted to the housing facing outwardly from the housing and having a back portion extending into the speaker portion of the acoustic chamber;

at least one duct extending through the housing and into the ducted port region of the acoustic chamber and terminating a spaced distance from the sound-absorbing interior of the acoustic chamber adjacent the sound passageway for projecting backwave sound generated at the back of the pairs of drivers and tweeters, through the speaker region, around the curtain, through the sound passageway and out through the duct whereby the distance between the backs of the pairs of drivers and the duct is sufficiently short to enable the backwave sound in the midrange frequencies from the pairs of drivers to be projected outwardly from the duct without being substantially absorbed in the speaker portion.

* * * * *